United States Patent
Yang et al.

(10) Patent No.: US 10,940,472 B2
(45) Date of Patent: *Mar. 9, 2021

(54) SUBSTRATE ASSEMBLY AND METHOD OF BONDING SUBSTRATES

(71) Applicant: TAIWAN GREEN POINT ENTERPRISES CO., LTD., Taichung (TW)

(72) Inventors: Sung-Yi Yang, Taichung (TW); Pao-Chuan Wang, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 188 days.

This patent is subject to a terminal disclaimer.

(21) Appl. No.: 16/176,348

(22) Filed: Oct. 31, 2018

(65) Prior Publication Data

US 2019/0126273 A1 May 2, 2019

(30) Foreign Application Priority Data

Nov. 1, 2017 (TW) .................................. 106137720

(51) Int. Cl.
*B01L 3/00* (2006.01)
*B81C 3/00* (2006.01)
(Continued)

(52) U.S. Cl.
CPC .... *B01L 3/502707* (2013.01); *B29C 65/1616* (2013.01); *B29C 65/1635* (2013.01);
(Continued)

(58) Field of Classification Search
CPC .. B01L 3/502707; B01L 3/5027; B01L 3/502; B01L 3/50; B29C 65/1616;
(Continued)

(56) References Cited

U.S. PATENT DOCUMENTS 8,951,716 B2 2/2015 Liu et al.
2011/0277361 A1* 11/2011 Nichol ................. G02B 6/0068
40/541
2014/0170333 A1 6/2014 Mazur et al.

FOREIGN PATENT DOCUMENTS

JP 2003043052 A 2/2003
JP 2005074796 A 3/2005
TW I263046 B 10/2006

OTHER PUBLICATIONS

JP 2005-07479 English Machine Translation, obtained from https://worldwide.espacenet.com/ on Jun. 29, 2020, pp. 1-16. (Year: 2020).*

(Continued)

*Primary Examiner* — Christine T Mui
(74) *Attorney, Agent, or Firm* — Young Basile Hanlon & MacFarlane, P.C.

(57) ABSTRACT

A substrate assembly and a method of bonding substrates are disclosed. The method includes steps of: providing two substrate; subjecting a connecting surface of each of the substrates to surface-modifying treatment to form surface-modified region respectively on each of the connecting surfaces; contacting the substrates in such a manner that the substrates are connected with each other through a physical interaction between the surface-modified regions; and laser irradiating and melting a portion of each of the connecting surfaces to form a respective bonding region, and solidifying the melted bonding regions of the substrates to bond the substrates together.

12 Claims, 16 Drawing Sheets

(51) Int. Cl.
    *B29C 65/00* (2006.01)
    *B29C 65/16* (2006.01)
    *B29C 65/82* (2006.01)
    *B29C 65/14* (2006.01)
    *B29L 31/00* (2006.01)

(52) U.S. Cl.
    CPC ...... *B29C 65/1658* (2013.01); *B29C 65/8207* (2013.01); *B29C 66/028* (2013.01); *B29C 66/1122* (2013.01); *B29C 66/53461* (2013.01); *B29C 66/73175* (2013.01); *B29C 66/73921* (2013.01); *B81C 3/001* (2013.01); *B01L 2200/12* (2013.01); *B01L 2300/0816* (2013.01); *B01L 2300/161* (2013.01); *B29C 65/16* (2013.01); *B29C 65/8215* (2013.01); *B29C 66/71* (2013.01); *B29C 66/8322* (2013.01); *B29C 66/919* (2013.01); *B29C 66/929* (2013.01); *B29C 66/949* (2013.01); *B29L 2031/756* (2013.01); *B81B 2201/058* (2013.01); *B81C 2201/019* (2013.01)

(58) Field of Classification Search
    CPC . B29C 65/1612; B29C 65/1603; B29C 65/16; B29C 65/14
    USPC .................................................. 422/503, 50
    See application file for complete search history.

(56) References Cited

OTHER PUBLICATIONS

JP 2003-043052 English Machine Translation, obtained from https://worldwide.espacenet.com/ on Jun. 29, 2020, pp. 1-43. (Year: 2020).*
Search Report appended to an Office Action issued to Taiwanese counterpart application No. 106137720 by the TIPO dated Sep. 26, 2018.

* cited by examiner

SUBSTRATE ASSEMBLY AND METHOD OF BONDING SUBSTRATES

CROSS-REFERENCE TO RELATED APPLICATION

This application claims priority of Taiwanese Patent Application No. 106137720, filed on Nov. 1, 2017.

FIELD

The disclosure relates to a substrate assembly and a method of bonding substrates, and more particularly to a substrate assembly and a method of bonding substrates by virtue of a physical interaction between surface-modified regions of the substrates and melt-bonding between bonding regions of the substrates.

BACKGROUND

Referring to FIGS. 1 and 2, a conventional method of bonding substrates of a microfluidic channel device for bioassays includes the following steps: (a) providing two substrates 11 made of cyclo-olefin polymer (COP); (b) applying vacuum ultraviolet (VUV) light to a surface of each of the two substrates 11 to obtain modified surfaces 111 on each of the two substrates 11; (c) contacting and thermo-compressing the modified surfaces 111 so that the substrates 11 are connected to each other and are bonded together so as to obtain a substrate assembly 1.

In step (b), hydrophilic functional groups such as an ether group, a ketone group or a carboxyl group are formed on the hydrophobic surfaces of the substrates 11, and in step (c), the two substrates 11 are bonded together through an attraction force that is generated by the hydrophilic functional groups on the modified surfaces 111. However, the obtained substrate assembly 1 may be susceptible to bending by an external force, resulting in separation of the two substrates 11. Moreover, moisture may easily enter the interface between the two substrates 11 over a long-term use, causing the attraction force on the surface of the substrates 11 to gradually disappear, which eventually results in separation of the two substrates 11.

Therefore, improvement in the conventional method of bonding substrates of a substrate assembly that is not easily bent by an external force and that the substrates thereof are not easily separated by avoiding moisture intrusion, remains a goal to be achieved.

SUMMARY

Therefore, an object of the disclosure is to provide a method of bonding substrates that can alleviate at least one of the drawbacks of the prior art.

Another object of the disclosure is to provide a substrate assembly that can alleviate the drawback of the prior art.

According to one aspect of the disclosure, the method of bonding substrates includes steps of:

providing a first substrate and a second substrate;

subjecting a first connecting surface of the first substrate and a second connecting surface of the second substrate to a surface-modifying treatment using an energy source, so as to form a first surface-modified region on the first connecting surface and a second surface-modified region on the second connecting surface;

contacting the first and second substrates in such a manner that the first and second substrates are connected with each other through a physical interaction between the first surface-modified region and the second surface-modified region; and irradiating a portion of the first connecting surface of the first substrate and a portion of the second connecting surface of the second substrate using a laser to melt the portions of the first and second connecting surfaces so as to form first and second bonding regions, respectively, and solidifying the melted first and second bonding regions so as to bond the first and second substrates together.

According to another aspect of the disclosure, the substrate assembly includes a first substrate and a second substrate. The first substrate includes a first bonding region and a first surface-modified region. The second substrate includes a second bonding region and a second surface-modified region. The first and second substrates are bonded together through a physical interaction of the first surface-modified region and the second surface-modified region and through melt-bonding between the first bonding region and the second bonding region.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
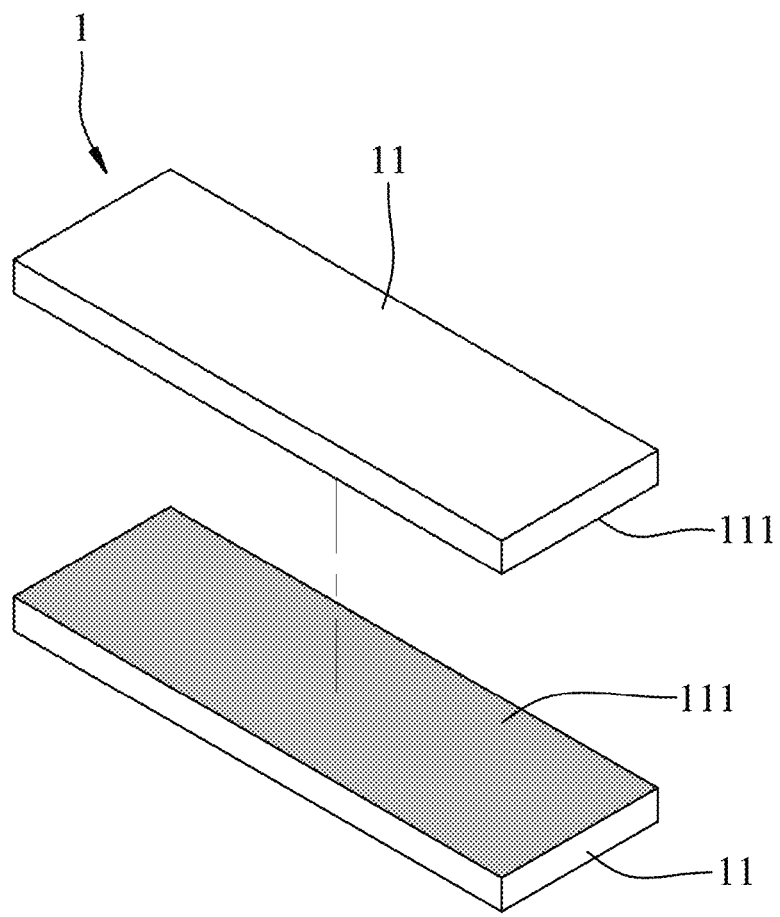
FIG. 1 is an exploded perspective view showing a substrate assembly produced by a conventional method of bonding substrates.
Figure 2:
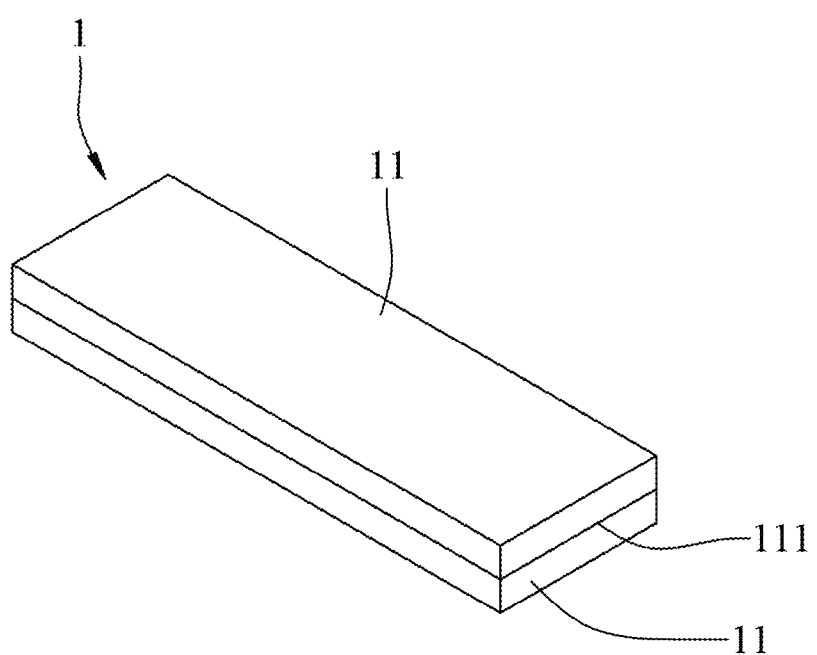
FIG. 2 is a perspective view showing the substrate assembly of FIG. 1.

Before the disclosure is described in greater detail, it should be noted that where considered appropriate, reference numerals or terminal portions of reference numerals have been repeated among the figures to indicate corresponding or analogous elements, which may optionally have similar characteristics.

Further, in describing representative embodiments of the present disclosure, the method and/or process of the present disclosure may be presented as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

Figure 3:
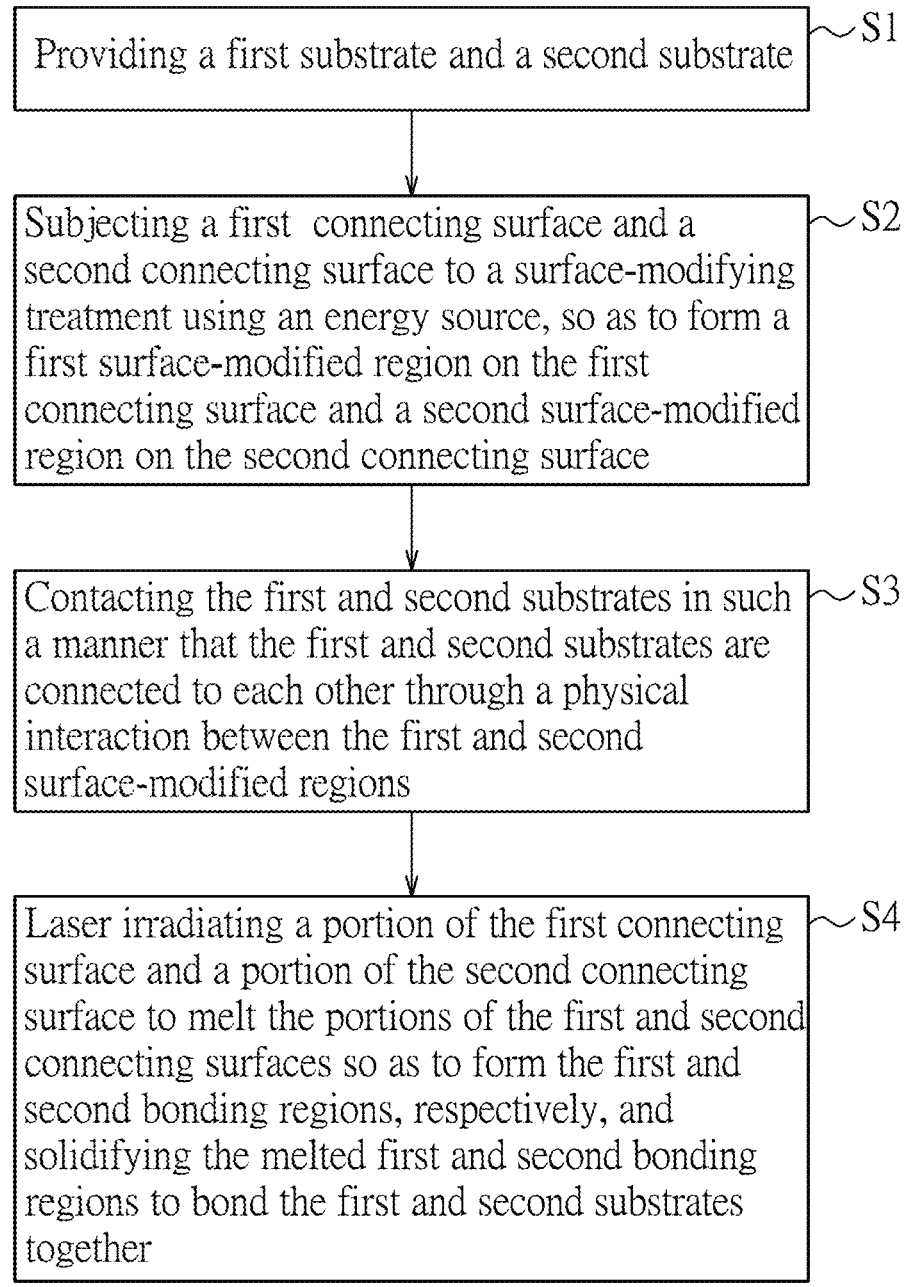
FIG. 3 is a flow chart illustrating a first embodiment of a method of bonding substrates according to the present disclosure.

A first embodiment of a method of bonding substrates of the present disclosure is suitable for preparing a substrate assembly, which may be a microfluidic channel device for detecting biological samples. Referring to FIG. 3, the first embodiment of the method of bonding substrates includes the steps as follows.

Figure 4:
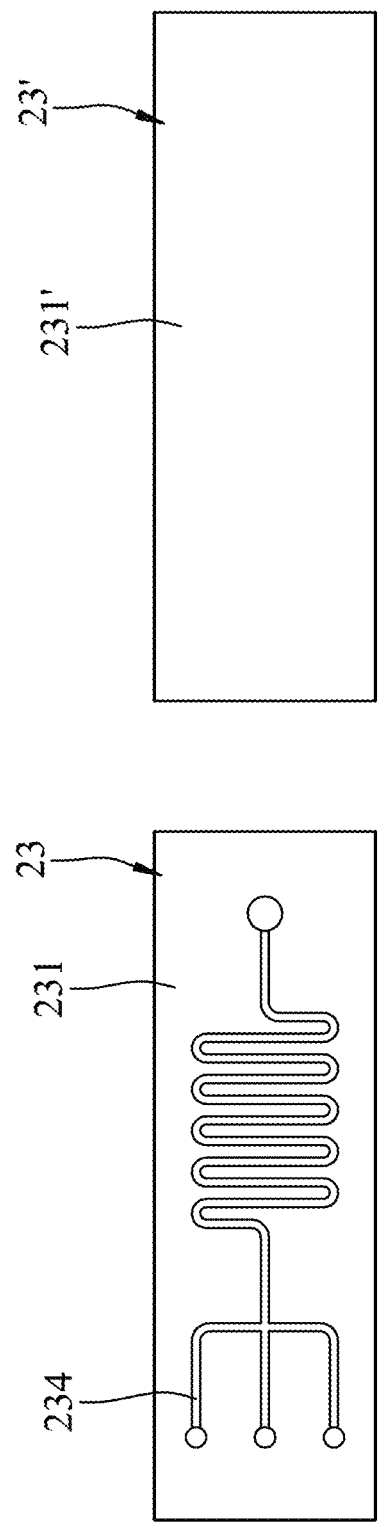
FIG. 4 is a schematic view illustrating providing a first substrate and a second substrate (step S1)

Step S1: providing a first substrate 23 and a second substrate 23'. As shown in FIG. 4, the first substrate 23 has a first connecting surface 231 and a first surrounding surface perpendicularly extending from a periphery of the first connecting surface 231, and the second substrate 23' has a second connecting surface 231' and a second surrounding surface perpendicularly extending from a periphery of the second connecting surface 231'. Each of the first substrate 23 and the second substrate 23' is made of a hydrophobic polymer material. Examples of hydrophobic polymer material suitable for the first substrate 23 and the second substrate 23' may include, but are not limited to, polymethylmethacrylate (PMMA), polycarbonate (PC), polystyrene (PS), cyclic olefin polymer (COP), polyethylene terephthalate (PET) or combinations thereof. One of the first and second substrates 23, 23' may be formed with a channel 234 for a fluid (e.g., as or a biological sample) flowing therein.

In this embodiment, the channel 234 is formed on the first connecting surface 231 of the first substrate 23. It should be noted that there is no particular restriction on the number and configuration of the channel 234. The first and second substrates 23, 23' may be individually formed with two or more channels 234 depending on actual need.

Figure 5:
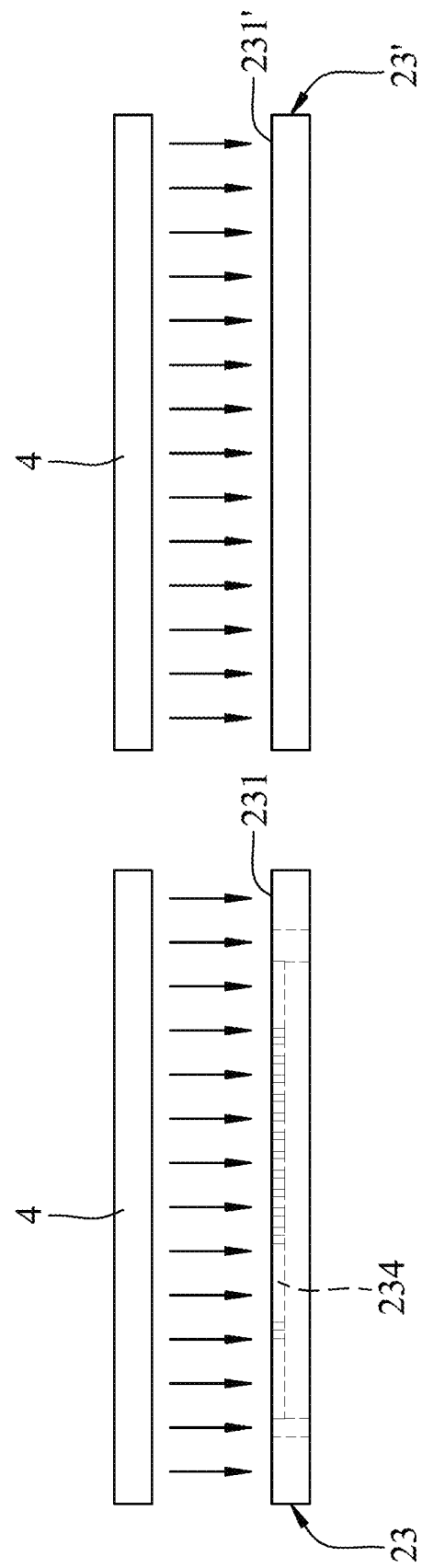
FIG. 5 is a schematic view illustrating subjecting a first connecting surface of the first substrate and a second connecting surface of the second substrate to a surface-modifying treatment using an energy source (step S2)
Figure 6:
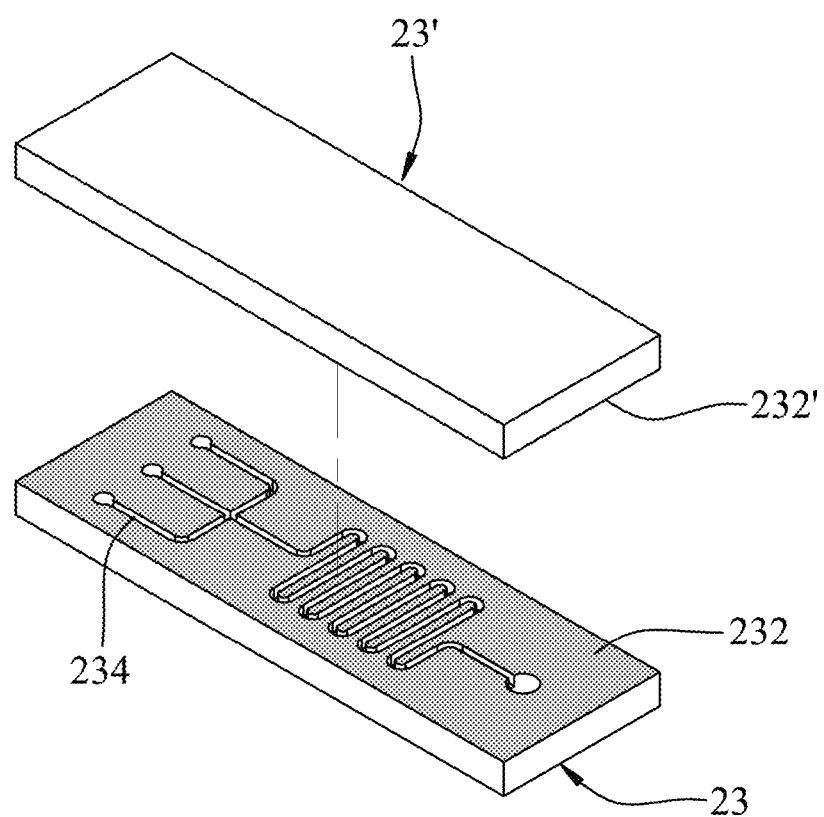
FIG. 6 is an schematic view illustrating forming a first surface-modified region on the first connecting surface and a second surface-modified region on the second connecting surface (step S2)

Step S2: subjecting the first connecting surface 231 of the first substrate 23 and the second connecting surface 231' of the second substrate 23' to a surface-modifying treatment using an energy source 4, so as to form a first surface-modified region 232 on the first connecting surface 231 and a second surface-modified region 232' on the second connecting surface 231' (see FIGS. 5 and 6). Each of the first and second surface-modified regions 232, 232' may have a plurality of hydrophilic functional groups, such as ketone groups, ether groups, carboxyl groups, etc. In this embodiment, the entire first and second connecting surfaces 231, 231' are subjected to the surface-modifying treatment, so that the first and second connecting surfaces 231, 231' are formed into the first and second surface-modified regions 232, 232' (shown in gray in FIG. 6).

According to this disclosure, the energy source 4 applied to the first and second connecting surface 231, 231' may be an ultraviolet light or plasma. Examples of ultraviolet light may include, but are not limited to, vacuum ultraviolet (VUV) having a wavelength ranging from 100 to 200 nm, medium ultraviolet (MUV) having a wavelength ranging from 200 to 300 nm, and near ultraviolet (NUV) having a wavelength ranging from 300 to 400 nm. Example of plasma may include, but is not limited to, oxygen plasma. The energy source may be applied to the first connecting surface 231 and the second connecting surface 231' for 25 to 185 seconds. Specifically, when ultraviolet light is used as the energy source 4, the surface-modifying treatment is performed by directly irradiating the first connecting surface 231 and the second connecting surface 231' with ultraviolet light. When oxygen plasma is used as the energy source 4, oxygen gas is introduced into an environment where the first connecting surface 231 and the second connecting surface 231' are located and simultaneously, high frequency electromagnetic waves is applied thereto, causing collision of the oxygen gas with electrons to ionize the oxygen gas, thereby generating oxygen plasma, which can modify the first connecting surface 231 and the second connecting surface 231'.

Figure 7:
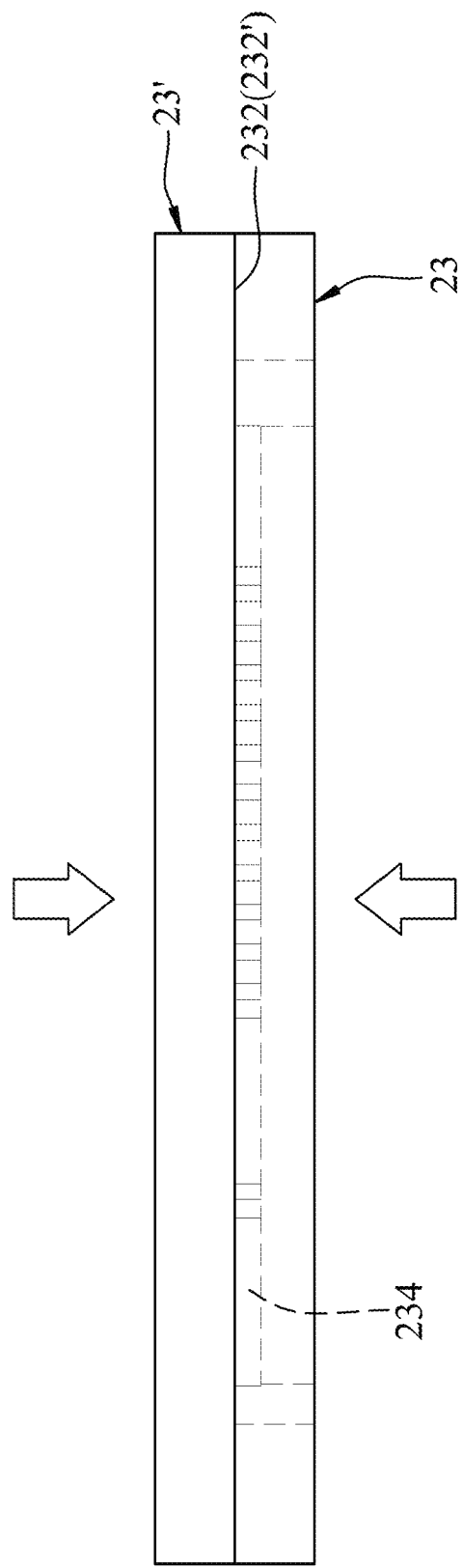
FIG. 7 is a schematic view illustrating connecting the first and second substrates to each other through a physical interaction between the first and second surface-modified regions by thereto-compression (step S3)

Step S3: contacting the first and second substrates 23, 23' in such a manner that the first and second substrates 23, 23' are connected to each other through a physical interaction between the first surface-modified region 232 and the second surface-modified region 232' (see FIG. 7). In this embodiment, the physical interaction between the first and second surface-modified regions 232, 232' is a hydrophilic interaction by virtue of the hydrophilic functional groups of the first and second surface-modified regions 232, 232'.

In certain embodiments, the step S3 is implemented by thermo-compression as shown by arrows in FIG. 7 at a temperature ranging from 80° C. to 130° C., under a pressure ranging from 20 kg/cm$^2$ to 35 kg/cm$^2$ for 2 minutes to 4 minutes.

It should be noted that, for achieving better connection between the first and second surface-modified regions 232, 232', the operation conditions of the steps S2 and S3 may be optimized according to the materials of the first and second substrates 23, 23'. The exemplified operation conditions of the steps S2 and S3 with respect to the materials of the first and second substrates 23, 23' are shown in Table 1.

TABLE 1

| | | Materials of the first and second substrates | | |
|---|---|---|---|---|
| | | PMMA | PC, PS, COP or PMMA | PET |
| Step S2 | Energy source | Medium or near ultraviolet | Vacuum ultraviolet | Oxygen plasma* |
| | Wavelength | 284~365 nm | 172 nm | — |
| | Power | 300 W | 10 W | 300 W |
| | Time | 180 seconds | 60 seconds | 30 seconds |
| Step S3 | Temperature | 90° C. | 80~130° C. | 120° C. |
| | Pressure | 30 kg/cm$^2$ | 30 kg/cm$^2$ | 24 kg/cm$^2$ |
| | Time | 3 minutes | 3 minutes | 3 minutes |

*Flow rate of the oxygen gas is 400 mL/min.

Figure 8:
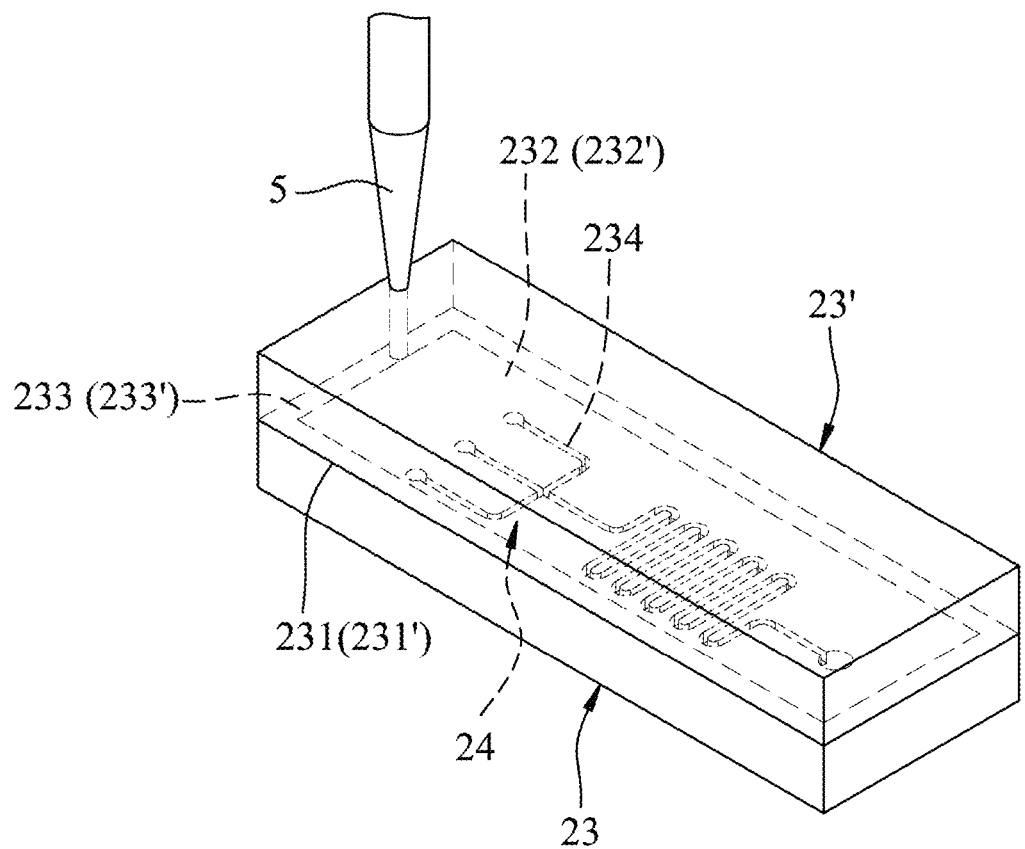
FIGS. 8 and 9 are fragmentary schematic views illustrating bonding the first and second substrates through melt-bonding of a first bonding region and a second bonding region by laser irradiation (step S4)
Figure 10:
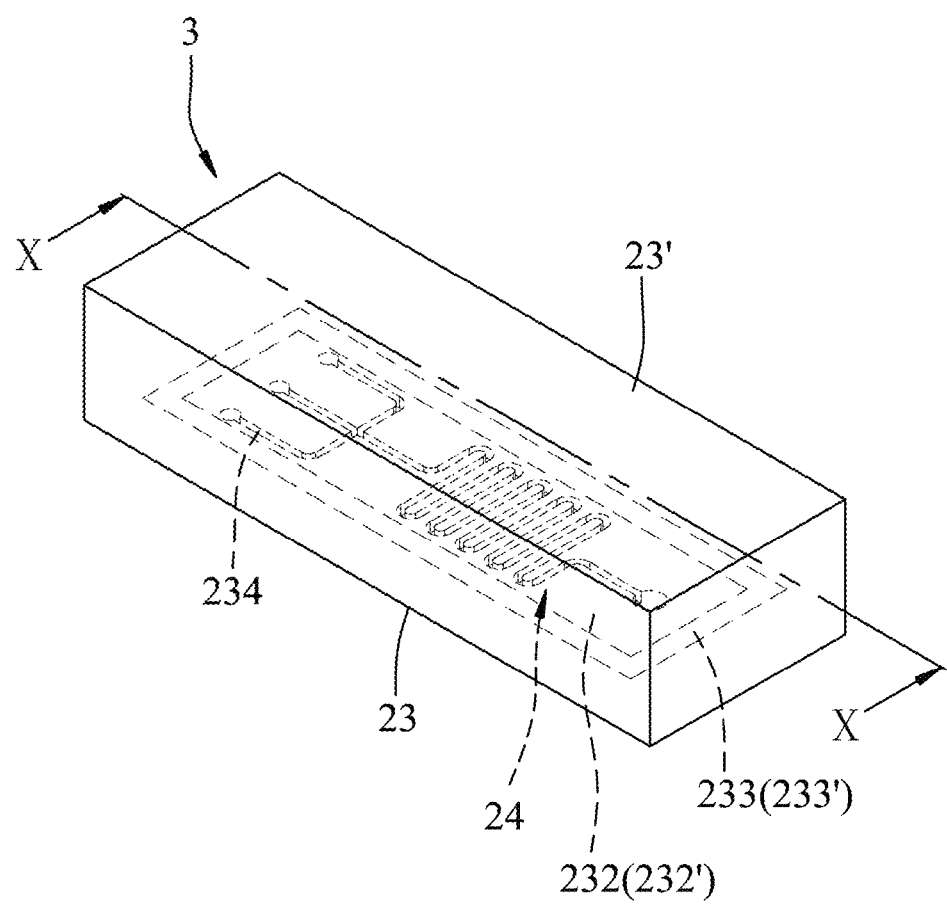
FIG. 10 is a schematic perspective view, illustrating a first embodiment of a substrate assembly prepared by the first embodiment of the method of bonding substrates according to the present disclosure.
Figure 11:
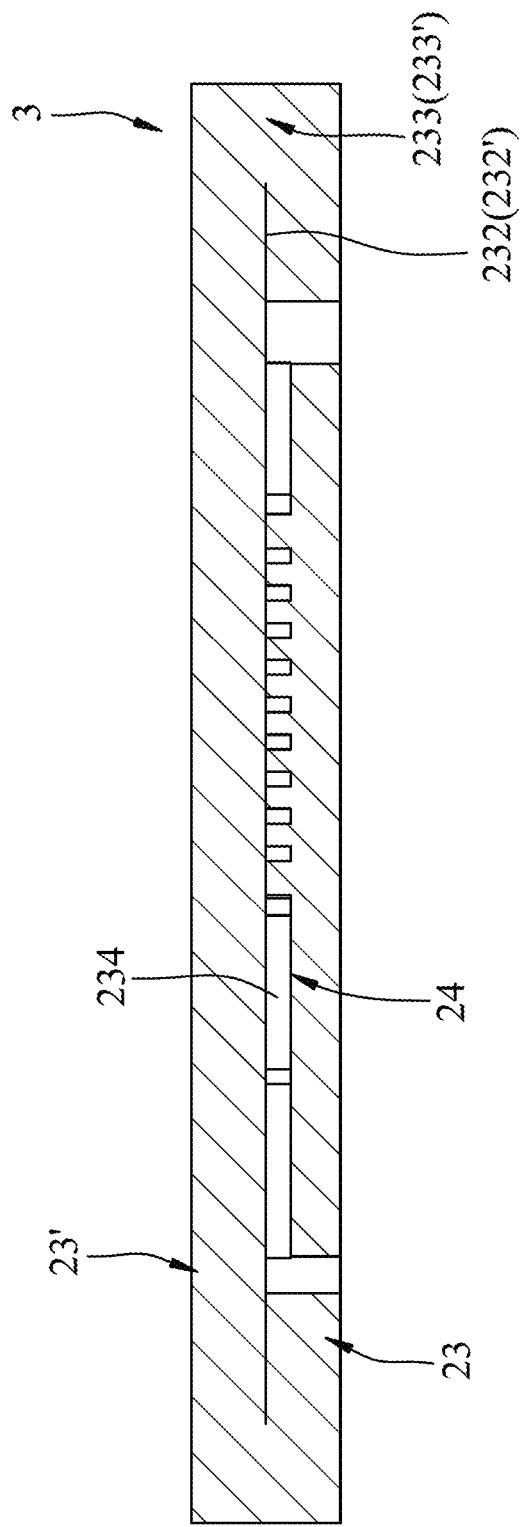
FIG. 11 is a schematic sectional view taken along a line X-X of FIG. 10.

Referring to FIG. 8, in step S4, a portion of the first connecting surface 231 (i.e., a portion of the first surface-modified region 232) of the first substrate 23 and a portion of the second connecting surface 231' (i.e., a portion of the second surface-modified region 232') of the second substrate 23' are irradiated using a laser 5 to melt the portions of the first and second connecting surfaces 231, 231' so as to form the first and second bonding regions 233, 233', respectively, and the melted first and second bonding regions 233, 233' are then solidified so as to bond the first and second substrates 23, 23' together, thereby obtaining a substrate assembly 3 (see FIGS. 10 and 11).

Figure 12:
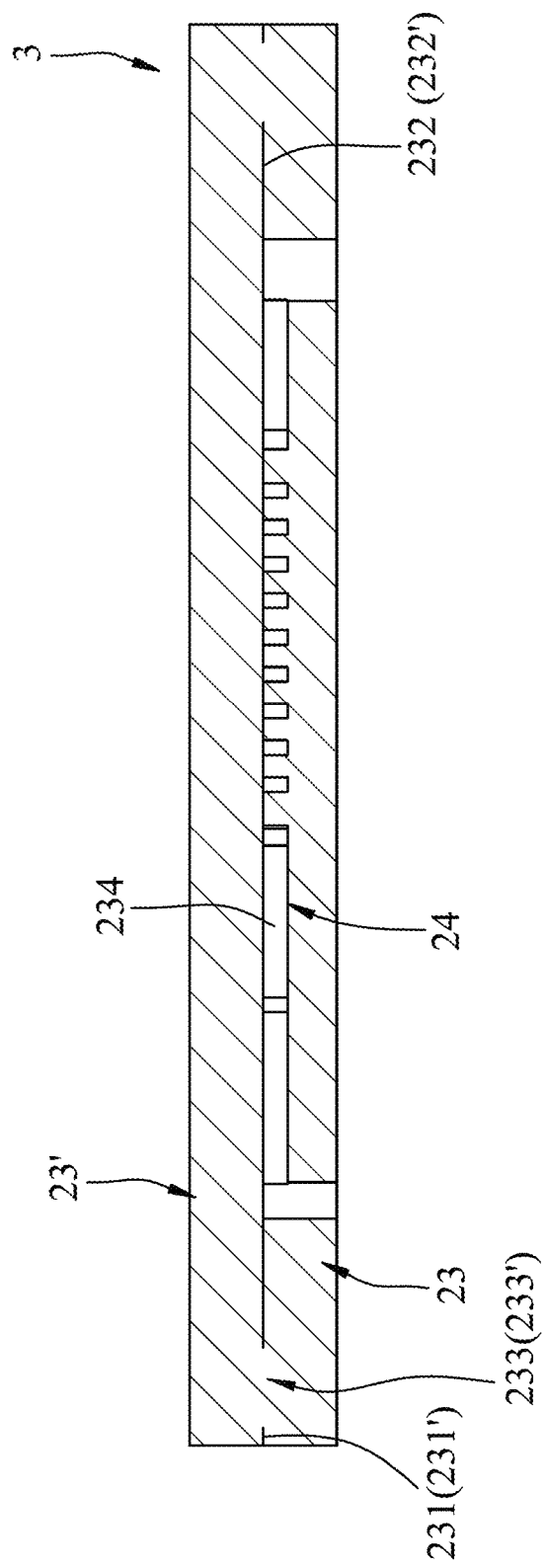
FIG. 12 is a schematic sectional view illustrating the substrate assembly prepared by a variation of the first embodiment of the method of bonding substrates.

In this embodiment, the laser 5 irradiates the first and second surface-modified regions 232, 232' to melt peripheral regions (that have the peripheries of the first and second connecting surface 231, 231') of the first and second surface-modified regions 232, 232'. It should be noted that the portions of the first and second connecting surfaces 231, 231' to be irradiated by the laser 5 may be decided according to actual requirement. For example, in a variation of the first embodiment, the laser irradiates the portions of the first and second connecting surfaces 231, 231' that are close to, but are spaced apart from the peripheral regions of the first and second connecting surfaces 231, 231'. As such, the peripheral regions of the first and second connecting surfaces 231, 231' are not melt-bonded in the resulting substrate assembly 3 (see FIG. 12).

After the first and second substrates 23, 23' are bonded together, the channel 234 is covered by the other one of the first and second substrates 23, 23' to define a microfluidic unit 24 disposed between the first and second substrates 23, 23'. In this embodiment, the microfluidic unit 24 is disposed between the first and second surface-modified regions 232, 232' and is surrounded and enclosed by the first and second bonding regions 233, 233'.

Figure 9:
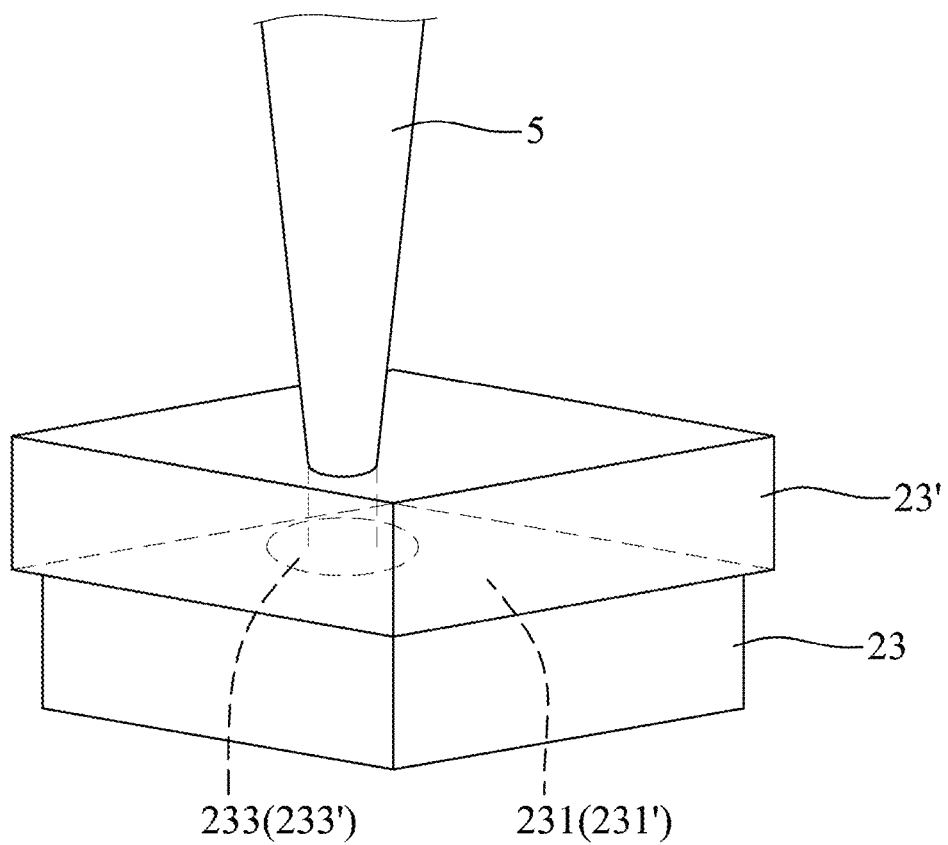

Further, referring to FIG. 9, step S4 may be implemented by irradiating a portion of the first connecting surface 231 of the first substrate 23 which connects to a corresponding portion of the second connecting surface 231' of the second substrate 23' using the laser 5 with a focal length set thereon (i.e., dotted circle portion shown in FIG. 9). The energy of the laser 5 applied on the portion of the first connecting surface 231 would be converted into a heat energy to melt the irradiated portion of the first connecting surface 231 so as to form the first bonding region 233, and then the heat energy is transferred to the corresponding portion of the second connecting surface 231' to melt the same, so as to form the second bonding regions 233'. After solidifying and cooling the melted first and second bonding regions 233, 233', the first and second substrates 23, 23' are bonded together. In this embodiment, the laser 5 is an infrared laser with a wavelength of 1064 μm, and a power ranging from 10 to 50 W.

According to this disclosure, the substrate assembly 3 made by the method of bonding substrates as mentioned above may be used with a biological detector to serve as a biological detecting device for detecting a biological sample, e.g., blood, urine, or interstitial fluid. The substrate assembly 3 may also be adapted to serve as a reactor for gas reactions (such as a hydrogen-oxygen reactor), as a photoelectric device, etc.

Referring to FIGS. 10 and 11, the first embodiment of a substrate assembly 3 (such as a microfluidic channel device) includes the first substrate 23, the second substrate 23', and the microfluidic unit 24.

The first substrate 23 includes the first bonding region 233 and the first surface-modified region 232. The second substrate 23' includes the second bonding region 233' and the second surface-modified region 232'. The first and second substrates 33, 33' are bonded together through the physical interaction (i.e., a hydrophilic-hydrophilic interaction in this embodiment) between the first surface-modified region 232 and the second surface-modified region 232', and through melt-bonding between the first bonding region 233 and the second bonding region 233'.

In certain embodiments, the first and second bonding regions 233, 233' are respectively located at peripheral regions of the first and second connecting surfaces 231, 231' to surround and enclose the first and second surface-modified regions 231, 232'. As such, the melt-bonded first and second bonding regions 233, 233' can serve as a barrier to prevent moisture from entering the interface of the bonded first and second substrates 23, 23' of the substrate assembly 3. In addition, the first and second substrates 23, 23' may exhibit excellent resistance to the external force, preventing the bonded substrates from separating easily.

The microfluidic unit 24 includes the channel 234 for a fluid (e.g., gas or a biological sample) flowing therein. The microfluidic unit 24 is disposed between the first and second substrates 23, 23', and is surrounded and enclosed by the first and second bonding regions 233, 233'.

Figure 13:
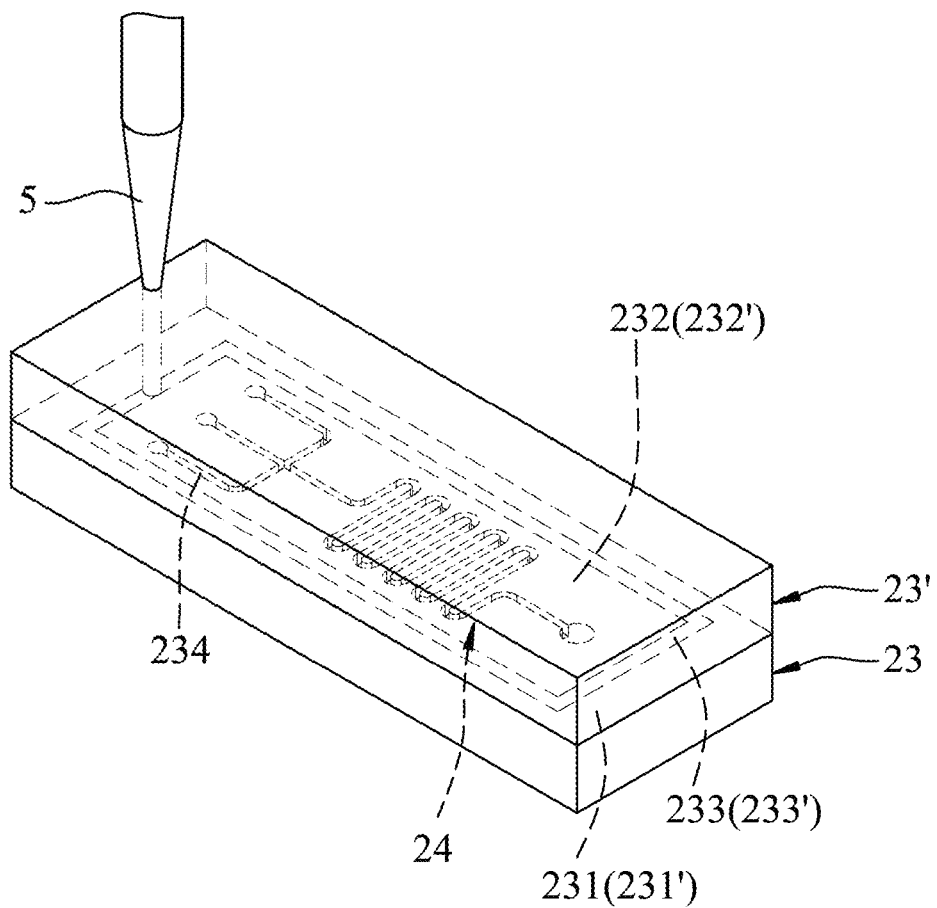
FIG. 13 is a fragmentary schematic view illustrating step S4 of a second embodiment of the method of bonding substrates.

Referring to FIG. 13, a second embodiment of a method of bonding substrates according to the present disclosure is similar to that of the variation of the first embodiment (i.e., FIG. 12), except that, in step S4 of the second embodiment, while melting the portions of the first and second connecting surface 231, 231' to form the first and second bonding regions 233, 233', the peripheral regions of the first and second connecting surfaces 231, 231' are cut from the first and second substrate 23, 23' by the laser 5. Thus, the configuration of the second embodiment of the substrate assembly 3 is the same as that of the first embodiment (see FIG. 10).

According to this disclosure, the wavelength and power of the laser 5 may be adjusted according to the thickness of the first and second substrates 23, 23'. The thicker the first and second substrates 23, 23' are, the higher the power required for the laser 5. In this embodiment, the laser 5 is a carbon dioxide laser with a wavelength ranging from 9.4 µm to 10.6 µm, and a power ranging from 10 W to 100 W.

Figure 14:
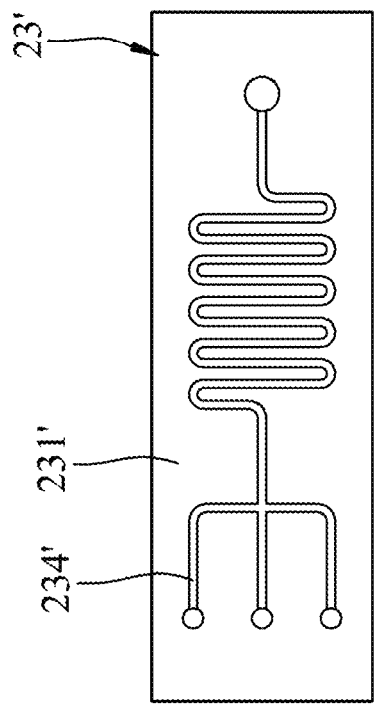
FIG. 14 is a schematic view showing the first and second substrates of a third embodiment of the substrate assembly, each substrate being formed with a channel.
Figure 14:
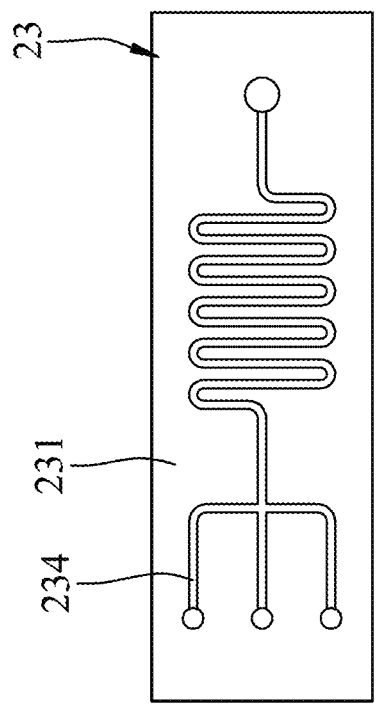
Figure 15:
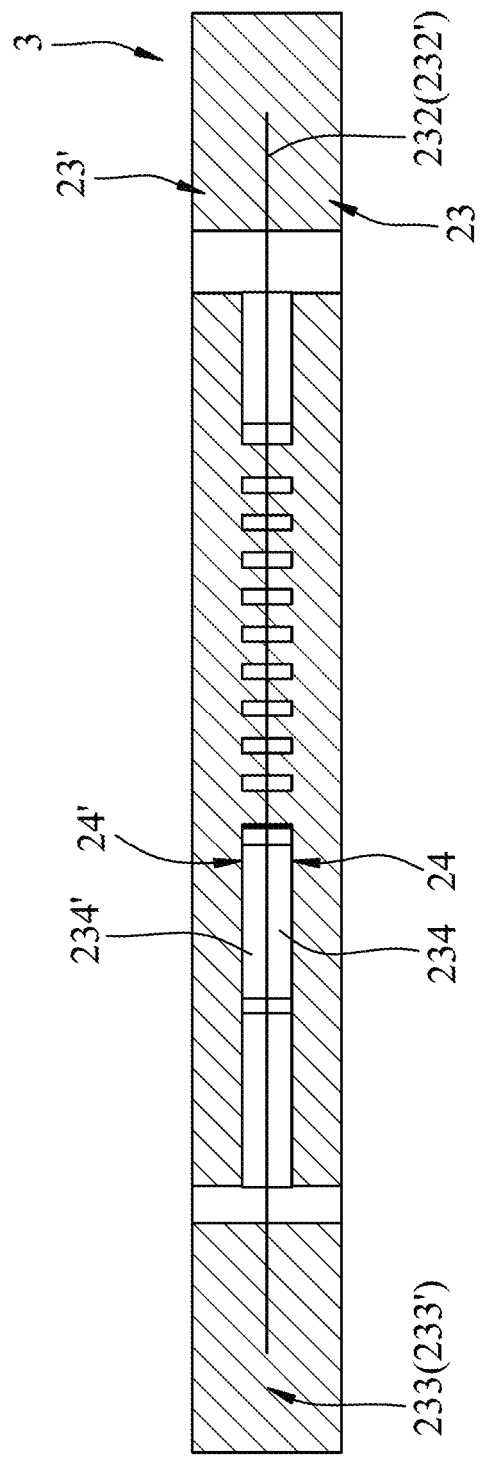
FIG. 15 is a sectional view showing the third embodiment of the substrate assembly.

Referring to FIGS. 14 and 15, a third embodiment of the substrate assembly 3 according to the present disclosure is similar to that of the first embodiment, except that, in the third embodiment, the channels 234, 234' that are respectively formed on the first connecting surface 231 of the first substrate 23 and the second connecting surface 231' of the second substrate 23' cooperatively define the microfluidic unit 24. The procedure to form the third embodiment of the substrate assembly is the same as that of the first embodiment.

It should be noted that, in this embodiment, the number of the channels 234, 234' formed on the first and second substrates 23, 23' is not particularly limited to one. For example, each of the first and second substrates 23, 23' may include two or more channels 234, 234' that may be communicating with each other. Alternatively, the two or more channels 234, 234' may be formed independently from each other. In such case, the substrate assembly 3 includes a plurality of independent microfluidic units 24.

The disclosure will be further described by way of the following examples. However, it should be understood that the following examples are solely intended for the purpose of illustration and should not be construed as limiting the disclosure in practice.

EXAMPLES

Preparation of a Substrate Assembly

Example 1 (E1)

Figure 16:
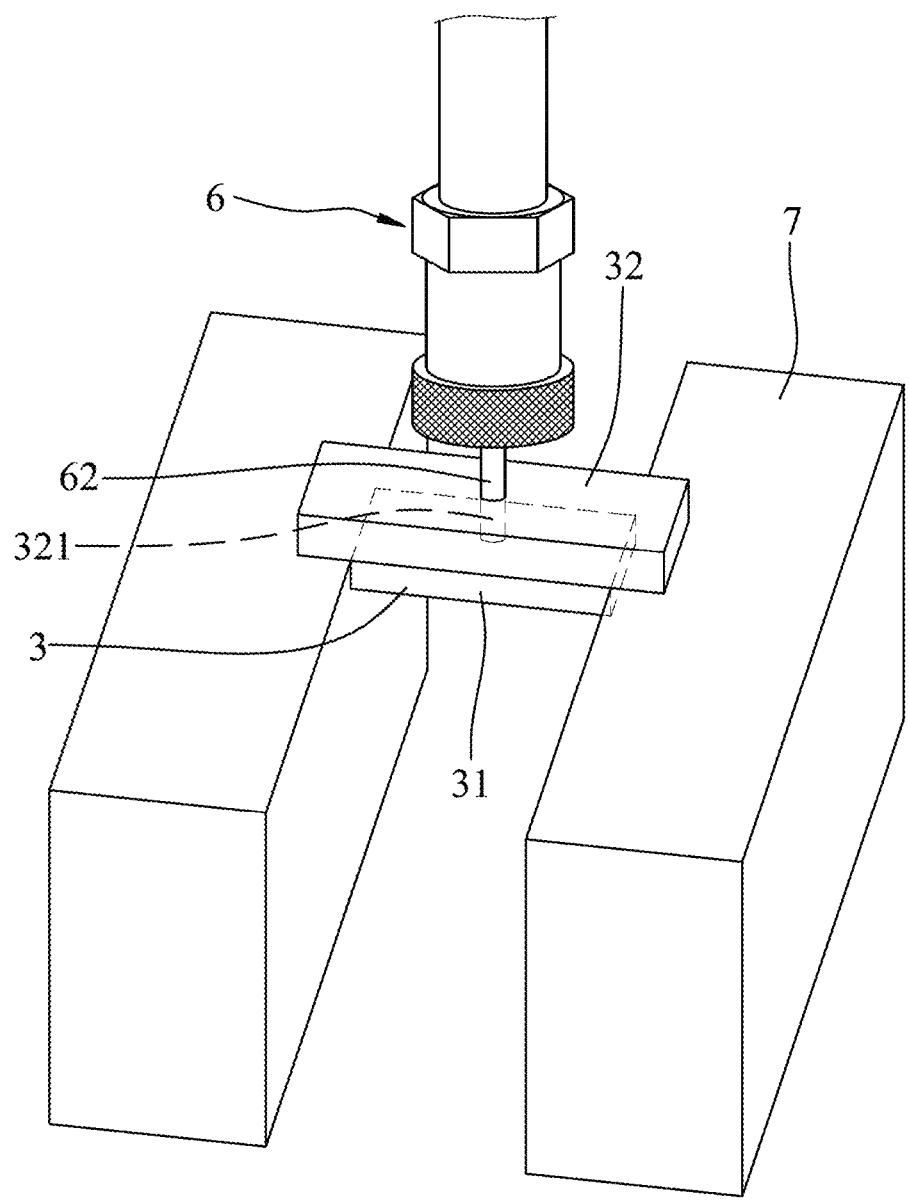
FIG. 16 is a fragmentary schematic view showing an instrument for determining bonding strength of the substrate assembly according to this disclosure.

As shown in FIG. 16, the substrate assembly 3 of E1 having a structure similar to that of the above-mentioned first embodiment was prepared as follows. Specifically, a first substrate 31 having a first connecting surface (15 mm×15 mm) and a second substrate 32 having a second connecting surface (15 mm×25 mm) were made of PMMA. The second substrate 32 was formed with a through hole 321 with a diameter of 2 mm. The first and second connecting surfaces were applied with VUV having a wavelength of 172 nm under a power of 10 W for 60 seconds, so as to form a UV modified-region having hydrophilic functional groups (i.e., hydroxyl groups) on each of the first and second connecting surface. Then, the first substrate 31 was contacted with the second substrate 32 through thermo-compression at 95° C. under a pressure of 30 kg/cm$^2$ for 3 minutes, in such a manner that the first and second substrates 31, 32 were connected with each other through a physical interaction (i.e., a hydrophilic interaction) between the UV modified-regions. Then, a periphery of the first connecting surface connected to the second connecting surface was laser irradiated to melt the periphery of the first connecting surface and a portion of the second connecting surface connected thereto, so as to form first and second bonding regions, respectively. After solidifying and cooling the melted first and second bonding regions, the first and second substrates 31, 32 were bonded together. The melt-bonded first and second bonding regions are surrounded and enclosed by the UV modified-regions.

Comparative Example 1 (CE1)

The substrate assembly 3 of CE1 was prepared according to the procedures similar to that for the substrate assembly 3 of E1, except that the step of laser irradiation was not conducted in CE1.

Determination of Bonding Strength

To determine the bonding strength between the bonded substrates, the substrate assembly 3 of each of E1 and CE1 was placed on a testing stand 7 as shown in FIG. 16, and then subjected to the following experiments.

Bonding Strength of the Substrate Assembly

A force gauge 6 (Manufacturer: ALGOL; Model: HF-10) having a protruding rod 62 (with a diameter of 0.15 mm) was provided. The protruding rod 62 was passed through the through hole 321 of the second substrate 32 to apply a thrust force to the first substrate 31 (0.01 mm per thrust). When the bonded first and second substrates 31, 32 started to detach from each other, the thrust force applied thereto was recorded.

Bonding Strength of the Substrate Assembly after Ultrasonic Oscillation Treatment The substrate assembly 3 of each of E1 and CE1 was placed in an ultrasonic oscillator (purchased from Elma Schmidbauer GmbH; Cat. No. S60H) and oscillated under an oscillation frequency of 37 kHz at 25° C. for 60 min. After standing for 12 hours, the bonding strength between substrates of the substrate assembly 3 was measured using the procedure and instrument described in the above section of "Bonding strength of the substrate assembly". When the bonded substrates started to detach from each other, the thrust force applied thereto was recorded.

Bonding Strength of the Substrate Assembly after Heating Treatment

The substrate assembly 3 of each of E1 and CE1 was heated in water at 98° C. for 30 minutes and then left standing for 12 hours. After that, the substrate assembly 3 of each of E1 and CE1 was subjected to a thrust force using the procedure and instrument described in the above section of "Bonding strength of the substrate assembly". When the bonded substrates started to detach from each other, the thrust force applied thereto was recorded.

Each of the thrust force (gf) applied to the substrate assembly 3 of each of E1 and CE1 before and after the ultrasonic oscillation treatment or the heating treatment is shown in Table 2. The higher the thrust force applied that causes the separation of the first and second substrates 31, 32, the higher the bonding strength of the substrate assembly 3 is.

TABLE 2

| | Applied thrust force (gf) | |
| --- | --- | --- |
| | E1 | CE1 |
| Before ultrasonic oscillation treatment or heating treatment | 9999 | 3050.4 |
| After ultrasonic oscillation treatment | 9999 | 1352.9 |
| After heating treatment | 8662 | 1228.7 |

It can be seen from Table 2 that the thrust force needed for separating the substrate assembly 3 of E1 (i.e., the bonding strength) is at least three times higher than that of CE1, either before or after one of the ultrasonic oscillation treatment and the heating treatment. In particular, the thrust force of E1 is more than seven times than that of CE1 after the ultrasonic oscillation treatment or the heating treatment. These results indicate that as compared with the substrate assembly 3 of CE1, the substrate assembly 3 of E1, which was made by the method that further includes the step of laser irradiation that results in melt-bonding between the first and second bonding regions of the substrates, exhibits superior bonding strength and is more resistant to the ultrasonic oscillation treatment and the heating treatment, thereby having a longer service life.

In summary, through the physical interaction of the first and second surface-modified regions and melt-bonding between the first and second bonding regions, the substrates of the substrate assembly are more stably bonded together, and the thus obtained substrate assembly of this disclosure is more resistant to external force, thereby preventing the bonded substrates from separating easily. In addition, with the first and second bonding regions surrounding the peripheries of the surface-modified regions, the substrates of the substrate assembly according to this disclosure could be seamlessly bonded together so as to prevent moisture from entering the interface of the bonded substrates.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of bonding substrates, comprising steps of:
   providing a first substrate and a second substrate;
   subjecting a first connecting surface of the first substrate and a second connecting surface of the second substrate to a surface-modifying treatment using an energy source, so as to form a first surface-modified region on the first connecting surface and a second surface-modified region on the second connecting surface;
   contacting the first and second substrates in such a manner that the first and second substrates are connected with each other through a physical interaction between the first surface-modified region and the second surface-modified region; and
   irradiating a portion of the first connecting surface of the first substrate and a portion of the second connecting surface of the second substrate that are close to, but are spaced apart from peripheral regions of the first and second connecting surfaces using a laser, such that the portions of the first and second connecting surfaces are melted to form first and second bonding regions, respectively; and
   cutting the peripheral regions of the first and second connecting surfaces that are not melt-bonded from the first and second substrates, respectively, using the laser, and then solidifying the melted first and second bonding regions so as to bond the first and second substrates together.

2. The method as claimed in claim 1, wherein:
   in the providing step, one of the first and second substrates is formed with a channel;
   after the first and second substrates are bonded together, the channel is covered by the other one of the first and second substrates to define a microfluidic unit disposed between the first and second substrates.

3. The method as claimed in claim 2, wherein the first and second bonding regions surround the microfluidic unit.

4. The method as claimed in claim 1, wherein the energy source is an ultraviolet light.

5. The method as claimed in claim 1, wherein the energy source is plasma.

6. The method as claimed in claim 1, wherein each of the first and second substrates is made of a hydrophobic polymer material.

7. A substrate assembly, comprising:
   a first substrate including a first bonding region and a first surface-modified region; and
   a second substrate including a second bonding region and a second surface-modified region,
   wherein said first and second substrates are bonded together through a physical interaction of said first surface-modified region and said second surface-modified region and melt-bonding between said first bonding region and said second bonding region, and
   wherein said first and second bonding regions are respectively at laser-cut peripheries of said first and second substrates, and respectively surround and enclose said first and second surface-modified regions.

8. The substrate assembly as claimed in claim 7, further comprising a microfluidic unit disposed between said first and second substrates.

9. The substrate assembly as claimed in claim 8, wherein said first and second bonding regions surround said microfluidic unit.

10. The substrate assembly as claimed in claim 7, wherein said first substrate and said second substrate are made of a hydrophobic polymer material.

11. The substrate assembly as claimed in claim 7, wherein said first surface-modified region of said first substrate has a plurality of hydrophilic functional groups.

12. The substrate assembly as claimed in claim 10, wherein said second surface-modified region of said second substrate has a plurality of hydrophilic functional groups, the physical interaction between said first surface-modified region and said second surface-modified region is a hydrophilic-hydrophilic interaction.

* * * * *